United States Patent
Neiss

(10) Patent No.: US 6,368,716 B2
(45) Date of Patent: Apr. 9, 2002

(54) FLAME RETARDANT ADHESIVE COMPOSITION AND LAMINATES

(75) Inventor: Melvin A. Neiss, Chadds Ford, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/909,732

(22) Filed: Jul. 20, 2001

Related U.S. Application Data

(62) Division of application No. 09/166,462, filed on Oct. 5, 1998.

(51) Int. Cl.$^7$ ................ B32B 17/10; B32B 27/05
(52) U.S. Cl. ............. 428/441; 428/463; 428/476.3; 428/473.5; 428/483; 428/516
(58) Field of Search ............... 428/463, 476.3, 428/473.5, 483, 416, 441

(56) References Cited

U.S. PATENT DOCUMENTS

| | | | |
|---|---|---|---|
| 4,727,107 A | 2/1988 | McConnell et al. | 524/371 |
| 5,041,484 A | 8/1991 | Atwell et al. | 524/278 |
| 5,331,040 A | 7/1994 | Lee | 524/522 |
| 5,376,718 A | 12/1994 | Yada | 524/409 |
| 5,443,911 A | 8/1995 | Schreiber et al. | 428/413 |

FOREIGN PATENT DOCUMENTS

EP 429027 5/1991

Primary Examiner—Peter D. Mulcahy

(57) ABSTRACT

This invention is directed to an adhesive composition comprising:
A. 80–98% by weight, based upon the total amount of adhesive dry solids, of at least one latex copolymer comprising:
  (1) 20–55% by weight, based upon the weight of the copolymer, of at least one brominated aromatic monomer,
  (2) 5–15% by weight, based upon the weight of the copolymer, of a monomer selected from the group consisting of glycidyl acrylate, glycidyl methacrylate, and mixtures thereof, and
  (3) 40–60% by weight, based upon the weight of the copolymer, of at least one non-brominated monofunctional(meth)acrylate monomer;
  (4) 0–10% by weight, based upon the weight of the copolymer, of a monomer selected from the group consisting of acrylonitrile, methacrylonitrile, and mixtures thereof;
B. 0–10% by weight, based upon the total amount of adhesive dry solids, of at least one crosslinking agent;
C. 1–10% by weight, based upon the total amount of adhesive dry solids, of at least one antimony oxide; and
D. 0–15% by weight, based upon the total amount of adhesive dry solids, of at least one viscosity modifier.

5 Claims, No Drawings

FLAME RETARDANT ADHESIVE COMPOSITION AND LAMINATES

This application is a division of U.S. application Ser. No. 09/166,462, filed Oct. 5, 1998.

BACKGROUND OF THE INVENTION

1. Field of Invention

This invention relates to a flame-retardant adhesive composition. More particularly it relates to an adhesive composition for dielectric films and is useful in the fabrication of solderable flexible circuits.

2. Description of the Related Art

The flexible circuit industry requires adhesives for dielectric film and metal foils (usually copper). The laminate, and hence the adhesive, must be able to withstand elevated temperatures and a variety of harsh solvents and chemicals, During the many preparation and processing steps for circuit manufacture, these solvents and chemicals can cause an adhesive to swell, leading to blister formation and/or delamination, which results in reduced circuit yields. The swelling can also open the adhesive matrix to ionics which can result in metal dendrite formation, reduced electrical resistance, and localized darkening or staining. The application of heat, such as in soldering, can similarly cause circuit failures and/or staining. In addition, it has become increasingly important for the adhesive compositions to be flame retardant. External fire sources or short circuits can cause a flexible circuit to burn if it is not flame retardant.

It is known that flame retardancy can be achieved by the addition of materials such as halogen-containing compounds, antimony oxide, or phosphorus compounds. In particular, brominated compounds have been used to achieve flame retardancy in hot melt adhesives, thermoplastic materials, and reinforcing resins, as described in, e.g., U.S. Pat. Nos. 4,727,107, 5,041,484, 5,376,718 and 5,443,911. However, to be useful as a flame retardant in an adhesive for electronic applications, a flame retardant material must satisfy several property requirements which are not necessary for hot melt adhesives or thermoplastic materials. For example, the flame retardant additive must not adversely affect the electrical properties of the composite structure. The additive must also not degrade the adhesive performance of the composite structure, both before and after soldering steps, i.e., the peel strength of the composite structure must not be substantially lower. And, the additive must be stable to processing solvents and chemicals.

Acrylic adhesive compositions with flame retardant additives or fillers for use in flexible circuits have been described in U.S. Pat. No. 5,331,040 and European Patent 429027. However, the addition of the flame retardant filler tends to make the adhesive more brittle, which adversely affects the peel strength of composite structures made with the filled adhesive. The brittleness generally can be overcome by the addition of plasticizers. However, the plasticizers must be chosen such that they are not attacked by processing chemicals, are stable at soldering temperature, etc. In addition, the fillers are generally composed of particles of a micron or more in size and tend to make the adhesive films opaque. Opaque films make inspection processes difficult.

Thus, there is a need for a relatively clear, flame-retardant adhesive composition for use with dielectric films in composite structures for electronic applications, which provides good adhesion throughout the life of the composite structure, and retains all the necessary properties, including electrical properties, of non-flame-retardant adhesives.

SUMMARY OF THE INVENTION

This invention relates to an adhesive composition comprising:

A. 80–98% by weight, based upon the total amount of adhesive dry solids, of at least one latex copolymer comprising:
  (1) 20–55% by weight, based upon the weight of the copolymer, of at least one brominated aromatic monomer,
  (2) 5–15% by weight, based upon the weight of the copolymer, of a monomer selected from the group consisting of glycidyl acrylate, glycidyl methacrylate, and mixtures thereof, and
  (3) 40–60% by weight, based upon the weight of the copolymer, of at least one non-brominated monofunctional (meth)acrylate monomer;
  (4) 0–10% by weight, based upon the weight of the copolymer, of a monomer selected from the group consisting of acrylonitrile, methacrylonitrile, and mixtures thereof;
B. 0–10% by weight, based upon the total amount of adhesive dry solids, of at least one crosslinking agent;
C. 1–10% by weight, based upon the total amount of adhesive dry solids, of at least one antimony oxide; and
D. 0–15% by weight, based upon the total amount of adhesive dry solids, of at least one viscosity modifier.

In a second aspect, this invention relates to a dielectric film or a release support coated with one or more coatings of the above adhesive composition.

In a third aspect, this invention relates to a composite structure comprising at least one substrate adhered to at least one above-described adhesive coated dielectric film.

DETAILED DESCRIPTION OF THE INVENTION

Component A comprises at least one latex copolymer. A single latex copolymer or a combination of two or more latex copolymers can be used. The term "copolymer" is intended to mean a polymer made from two or more different monomers, and includes terpolymers, tetrapolymers, etc. The flame retardancy for the adhesive is largely incorporated directly into the copolymer, by the use of brominated aromatic monomers. This eliminates the need to add separate brominated flame retardant fillers, thus maintaining the transparency of the adhesive film.

The first monomer in the copolymer is a brominated aromatic monomer. A single brominated aromatic monomer or a combination of two or more brominated aromatic monomers can be used. This monomer provides flame retardancy. In addition it provides high temperature stability and hardness. A preferred type of brominated monomer is a styrene or styrene derivative with bromine substitution in the phenyl nucleus. Mono-, di-, tri- and tetra- substitution can be used. Representative brominated aromatic monomers include styrene, methylstyrene, alpha-methylstyrene, alpha-methyl methylstyrene, ethylstyrene, alpha-methyl ethylstyrene, phenylacrylate, phenylmethacrylate, and mixtures thereof, each having bromine substitution in the aromatic ring.

The brominated aromatic monomer is present in an amount of from about 20 to 55% by weight, preferably from about 30 to 40% by weight, based on the weight of the copolymer. Preferably there is from about 10 to 40% bromine by weight, most preferably from 15 to 25% bromine by weight, based on the weight of the copolymer.

The second monomer in the copolymer is glycidyl acrylate, glycidyl methacrylate, or mixtures thereof, collectively referred to as glycidyl (meth)acrylate. This monomer also provides toughness and high temperature resistance. The glycidyl (meth)acrylate is present in an amount of from about 5 to 15% by weight, preferably from about 8 to 12% by weight, based on the weight of the copolymer.

The third monomer is a non-brominated monofunctional alkyl acrylate, alkyl methacrylate, or mixture thereof, collectively referred to as alkyl (meth)acrylates. As used herein, (meth)acrylate refers to esters and does not include the free acids. A single (meth)acrylate or a combination of two or more (meth)acrylates can be used. This component provides the flexibility and necessary softness to the adhesive composition. In general, the alkyl (meth)acrylates are esters of (meth)acrylic acid with alcohols having 1 to 20 carbon atoms, preferably from 2 to 10. Examples of suitable alkyl (meth)acrylates include methyl (meth)acrylate, ethyl (meth)acrylate, n-propyl (meth)acrylate, isopropyl (meth)acrylate, n-butyl (meth)acrylate, isobutyl (meth)acrylate, n-amyl (meth)acrylate, n-hexyl (meth)acrylate, isohexyl (meth)acrylate, 2-ethylhexyl (meth)acrylate, n-heptyl (meth)acrylate, isoheptyl (meth)acrylate, 1-methylheptyl (meth)acrylate, n-octyl (meth)acrylate, 6-methylheptyl (meth)acrylate, n-nonyl (meth)acrylate, n-decyl (meth)acrylate, and lauryl (meth)acrylate. Preferred alkyl (meth)acrylates include ethyl acrylate, butyl acrylate, 2-ethylhexyl acrylate, lauryl acrylate, lauryl methacrylate, octyl acrylate, and heptyl acrylate. The third monomer is present in an amount of from about 40 to 60% by weight, preferably 45 to 55% by weight, based on the weight of the copolymer.

An optional fourth monomer is (meth)acrylonitrile, by which is meant acrylonitrile, methacrylonitrile, and mixtures thereof. The (meth)acrylonitrile is present in an amount of no greater than about 10% by weight, based on the weight of the copolymer; preferably about 5 to 10% by weight. In earlier disclosed acrylic adhesive compositions, such as those disclosed in U.S. Pat. Nos. 3,822,175; 4,980,410; and 5,331,041 (meth)acrylonitrile was a key component, providing high temperature stability and chemical resistance, as well as hardness and resistance to creep. It was surprising and unexpected that this component of the copolymer could be eliminated or so greatly reduced without sacrificing those properties in the adhesive and laminate. At the same time, it was advantageous to minimize the (meth)acrylonitrile content due to its toxicity and handling restrictions, plus its deterioration of end use properties. Acrylonitrile has been linked to staining, reduced electrical resistance, and dendrite formation.

An optional fifth monomer is a multifunctional (meth)acrylate monomer. A single multifunctional (meth)acrylate monomer or a combination of two or more multifunctional (meth)acrylate monomers can be used. This component can also add to the stability of the final composition. However, if too much multifunctional monomer is present, the resulting adhesive film can be brittle. In general, the multifunctional monomer is present in an amount no greater than about 10% by weight, based on the weight of the copolymer; preferably about 0.1 to 5% by weight.

The multifunctional (meth)acrylates are generally esters of (meth)acrylic acid with diols and polyols. The diols and polyols are generally aliphatic and cycloaliphatic compounds of 2 to 30 carbon atoms, having two or more hydroxyl groups. Examples of suitable multifunctional (meth)acrylates include, ethylene glycol di(meth)acrylate, butanediol di(meth)acrylate, hexanediol di(meth)acrylate, cyclohexanediol di(meth)acrylate, trimethylolpropane tri(meth)acrylate, ethoxylated trimethylolpropane tri(meth)acrylate, pentaerythritol tri(meth)acrylate, dipentaaerythritol tetra(meth)acrylate, and others.

The copolymer is present in an amount of about 80 to 98% by weight, preferably about 90 to 97% by weight, based on the total amount of adhesive dry solids.

A crosslinking agent, component B, may be added to increase the stability of the adhesive composition. A single crosslinking agent or a combination of two or more crosslinking agents can be used. Examples of crosslinking agents are well known and include formaldehyde resins, novolak resins and epoxy resins. A preferred crosslinking agent is a water-soluble phenol formaldehyde resin. The crosslinking agent, when present, is usually present in an amount no greater than about 10% by weight, based on the total amount of adhesive dry solids; preferably, about 0.5 to 5% by weight.

Component C of the adhesive composition is antimony oxide, which improves the flame retardancy. Either antimony trioxide or antimony pentoxide can be used. Mixtures of antimony oxides can also be used. It is preferred to use antimony pentoxide; more preferably, a colloidal dispersion of submicron particles of antimony pentoxide. The antimony oxide is generally present in an amount of about 1 to 10% by weight, preferably about 1 to 5% by weight, based on the total amount of adhesive dry solids.

Optionally, the adhesive composition can contain component D, a viscosity modifier. A single viscosity modifier or a combination of two or more viscosity modifiers can be used. In general, viscosity modifiers, or thickeners, are added to improve the coatability of the adhesive composition. Any conventional thickener can be used as long as it does not adversely affect the other properties of the adhesive composition. Examples of suitable viscosity modifiers include high molecular weight polymers such as poly(vinylalcohol), poly(ethylene oxide), and polyacrylates plus base. The polyacrylate plus base thickener, referred to herein as "polyacrylate/base," is a (meth)acrylate polymer or copolymer having acid functionality in combination with a base (hydroxide or amine) which reacts with at least some of the acid groups. For the compositions of the invention, it is preferred that the base is ammonium hydroxide or a volatile amine, such as methyl amine. The polymer and the base are added separately to the composition. The viscosity modifier is generally present in an amount up to about 15% by weight, preferably about 0.1 to 5% by weight, based on the total amount of adhesive dry solids.

The adhesive composition can also contain small amounts of other materials to improve the shelf life of the adhesive, such as surfactants, dispersants, coalescence aids, coating aids, and the like. All such components should have little or no deleterious effect on the physical properties of the adhesive composition. In general, the amount of such components should be kept to a minimum.

The adhesive compositions of the invention can be made from latex copolymers made using known free-radical initiated emulsion polymerization techniques, such as those disclosed in Sanderson, U.S. Pat. No. 3,032,521, and Fryd et al., U.S. Pat. No. 4,980,410. In general, the copolymers are prepared by emulsion polymerization. The monomers are added to water with a suitable dispersing agent or surfactant. The temperature is then increased and optionally a catalyst is added under an inert atmosphere and the polymerization reaction allowed to proceed while maintaining the temperature. The copolymer can be isolated or used directly as the aqueous dispersion. When used directly, the dispersion will include some materials from the preparation, such as surfactants, spent initiator, and the like.

Preferably, the adhesive composition is stored as a latex or dispersion in water. Although not preferred, the adhesive can be contained as a dispersion or solution in a suitable organic liquid or mixtures of organic liquids.

The adhesive compositions of the invention can be applied to various substrates to form composite structures.

By "composite structure" is meant one or more layers of adhesive in combination with one or more substrates and other layers. The composite structures can be made by any conventional processes including coating and lamination processes, and combinations of processes.

The adhesive composition can be prepared in an unsupported form by application to a release substrate such as coated paper or polyester. It can then be stored in roll form. This is commonly referred to as sheet adhesive.

Alternatively, the adhesive composition can be coated directly onto one or both sides of a non-release substrate. A layer of adhesive coated onto one side of a non-release substrate is generally referred to as coverlay. Adhesive coated onto both side of a non-release substrate is generally referred to as bondply. Examples of suitable non-release substrates include polyimide film, polyamide film, polyester films, including polyethylene terephthalate and polyethylene naphthalate, liquid crystal polymer films, polyaramid paper, woven polyaramid fabric, woven glass fabric, non-woven glass fabric, PEEK, PEKK, and fabrics impregnated with polyimide or epoxy resin. The adhesive composition can be applied by conventional application procedures such as spraying, printing, brushing, dip coating, roll coating, extrusion die coating, bar coating, and the like. The adhesive can be applied in varying thicknesses, depending on the desired end use. Greater thicknesses can be achieved by a plurality of coats. Generally, the acrylic adhesive will have a thickness of at least 0.1 mil (2.5 micrometers) and should not exceed about 20 mils (508 micrometers). A preferred thickness is 0.1 to 10 mils (2.5 to 254 micrometers), with 0.5 to 3 mils (13 to 76 micrometers) being especially preferred.

A preferred substrate is polyimide film. The term "polyimide film" is intended to encompass a layer of polyimide or polyimide that contains filler, such as particulate material, silica or fibers of glass, boron, polyester, polyamide, acrylic, aramid, etc. Polyimides suitable for use in practicing the invention are disclosed in U.S. Pat. No. 3,179,634. The thickness of the polyimide film will depend on the final application, however, it is generally from about 0.5 to 5.0 mils (13 to 127 micrometers) thick. It is sometimes desirable to treat the surface of the polyimide film to improve its adhesion. Suitable surface treatments have been described in U.S. Pat. Nos. 3,821,016, 4,426,253 and 4,725,504.

The adhesive coated polyimide films of the invention can be adhered to suitable substrates to form further composite structures. Suitable substrates include metal and especially metal foils of copper, aluminum, nickel, silver, gold, iron or their alloys; woven and non-woven fabrics made from natural or synthetic fibers such as glass, boron, polyester, polyamide, acrylic, etc.; woven and non-woven fabric impregnated with resin such as polyimide, polyamide, epoxy, acrylic; paper of natural or synthetic fibers such as aramid paper; and films of polymer such as polyimide, polyamide, polyester, acrylic, epoxy, polyurethane, etc. Preferred substrates include metal, polyimide film, aramid paper, woven and nonwoven glass fabric, and polyimide or epoxy impregnated glass fabric. Particularly preferred is copper foil. Copper foils with various surface treatments can be used.

Various techniques can be used to join material surfaces using the adhesive compositions of the invention. For example, when the adhesive has been applied as a film to a release support such as release-coated polyester film or polymer-coated paper, two materials can be joined by applying the exposed layer of the adhesive film to one of the materials, peeling off the substrate support from the adhesive film, thus exposing a second surface of the adhesive, and then laminating the second layer of material to the exposed surface of the adhesive film under heat and pressure sufficient to form an adhesive bond that is thermally and chemically stable.

On the other hand, when the adhesive composition is applied to a non-release support, e.g., a polyimide film, the polyimide film can be joined to a second material such as a printed circuit board or metal foil by laminating the polyimide-coated adhesive film to the second material under heat and pressure sufficient to form an adhesive bond that is thermally and chemically stable.

Standard lamination procedures can be used to make the laminates. These include vacuum bag lamination, press lamination, roll lamination, etc. In each case, the laminates are cured, usually under pressure. Typical lamination conditions are about 175–220° C. and about 250–400 psi (44.7–71.5 kg/cm$^2$) for about 30–90 minutes. The time given indicates time spent at the maximum temperature and pressure.

EXAMPLES

To further illustrate the invention, the following examples below are provided, but are not intended to be limiting.

| | Abbreviations |
|---|---|
| ASE-60 | Acrysol ® ASE-60 polyacrylate thickener from Rohm and Haas (Philadelphia, PA), neutralized with ammonium hydroxide |
| AN | acrylonitrile |
| BA | butyl acrylate |
| crosslinker | phenol formaldehyde resin, Ucar ® Phenolic Resin GP-5200, from Georgia Pacific (Columbus, OH) provided as a 66–68% aqueous solution |
| Cu-black | 1 ounce/ft$^2$ (0.061 g/cm$^2$) Somers RA (roll annealed copper foil, Classification 110, black-treated; from Olin Brass (East Alton, IL) |
| Cu-pink | 1 ounce/ft$^2$ (0.061 g/cm$^2$) Somers RA (roll annealed copper foil, Classification 110; from Olin Brass (East Alton, IL) |
| DBS | mixture of brominated styrenes, primarily dibromostyrene, Great Lakes DBS from Great Lakes Chemical Co. (West Lafayette, IN) |
| GMA | glycidyl methacrylate |
| HAD | hexanediol diacrylate |
| MAA | methacrylic acid |
| PEO | polyethylene oxide, Polyox ® WSR-301 from Union Carbide (Danbury, CT) |
| Sb$_2$O$_5$ | supplied as 20–30% solids colloidal dispersion of antimony pentoxide, Nyacol ® from PQ Corp. (Valley Forge, PA) |
| Surfactant 1 | sodium lauryl sulfate, Duponol ® WAQE from Witco Corp. (Houston, TX) |
| Surfactant 2 | Pluronic ® L-64 from BASF Corp. (Mt. Olive, NJ) |

Preparation of Latex Copolymers

The latex copolymers were prepared using conventional emulsion polymerization techniques, such as described in Example 1 of Fryd et al., U.S. Pat. No. 4,980,410, and S. R. Sandler & W. Karo, "Polymer Syntheses," Vol. I, Chapter 10 (Academic Press, 1974).

The latex copolymers of the invention had the following compositions, by weight, and were added as 40–50% solids:

| | |
|---|---|
| Copolymer 1 | BA/DBS/GMA, 50/40/10 |
| Copolymer 2 | BA/DBS/AN/GMA, 55/25/10/10 |
| Copolymer 3 | BA/DBS/AN/GMA/HDA, 50/30/10/9.5/0.5 |
| Copolymer 4 | BA/DBS/AN/GMA, 48/35/8/9 |
| Copolymer 5 | BA/DBS/AN/GMA, 50/35/5/10 |

The copolymers for the comparative examples had the following compositions, by weight, and were added as 50% solids:

| | |
|---|---|
| Comp. copolymer A | BA/DBS/MAA, 53/42/5 |
| Comp. copolymer B | BA/DBS/MAA, 55/40/5 |

Preparation of Composite Structures (1) Polyimide-adhesive coverlay. Adhesive compositions were coated onto Kapton® polyimide film (E. I. du Pont de Nemours and Company, Wilmington, Del.) using conventional coating techniques. The coatings were dried and then laminated with a 1.4 mil (0.0035 cm) coversheet of Mylar® polyethylene terephthalate (E. I. du Pont de Nemours and Company, Wilmington, Del.) at 150–225° F. (65–107° C.).

(2) Single-sided copper clad composite. The coversheet from the above coverlay was removed and the adhesive coating was placed in contact with the treated side of a 1 ounce/ft$^2$ (0.061 g/cm$^2$) sheet of roll annealed copper foil. This was press laminated to form a single-sided copper clad composite.

(3) Double-sided copper clad composite.

Type I: The adhesive side of the adhesive-polyimide coverlay was overlaid with a 1 ounce/ft$^2$ (0.061 g/cm$^2$) sheet of roll annealed copper foil. The reverse side of the polyimide was overlaid with 2 mil (0.0051 cm) thick Pyralux® LF sheet adhesive (E. I. du Pont de Nemours and Company, Wilmington, Del.). The second adhesive was placed in contact with the treated side of another sheet of roll annealed copper foil (1 ounce/ft$^2$, 0.061 g/cm$^2$). The composite was press laminated at 375° F. (190° C.) and 300 psi (53.6 kg/cm$^2$) for 60 minutes.

Type II: Adhesive compositions were coated onto both sides of 1 mil (0.0025 cm) thick Kapton® polyimide film using conventional coating techniques. After drying, the adhesive layers had a thickness of 1 mil (0.0025 cm). Temporary protective cover sheets were laminated to both sides to facilitate handling. After removal of the coversheets, both sides were placed in contact with the treated side of 1 ounce/ft$^2$ (0.061 g/cm$^2$) sheets of roll annealed copper foil. The composites were vacuum laminated at 375° F. (190° F.) and 350 psi (62.5 kg/cm$^2$) for 60 minutes.

Test Procedures

1. Peel Strength: Test IPC-TM-650, method 2.4.9, Revision C.

The peel strengths were measured on double-sided copper clad composites both prior to solder testing, which is conventionally referred to as "as received" (AR), and after solder testing (AS).

2. Flame Test: UL94 VTM-O

3. Solder Float Test

This test was performed to determine the thermal and thermal shock resistance of copper clad materials. Test samples were 2×2 inch (5.1×5.1 cm) double sided copper clad composites of either Type I or Type II. With Type I, the adhesive of the invention side was placed down in the solder. Each sample was placed onto molten 60/40 tin/lead solder at 550° F. (288° C.) and tested to failure or to 120 seconds, whichever came first. In some cases, the samples were tested to 180 seconds. Failure is defined as blistering or delamination. The average time to failure for each candidate was reported.

The moisture and insulation resistance test was performed to evaluate, in an accelerated manner, the effects of high humidity and heat conditions on candidate dielectric adhesives. Copper clad composites were used to make test samples. Each sample was treated using conventional techniques to form a 12.5 mil (0.031 mm) line/12.5 mil (0.031 mm) space comb conductor pattern: a photoresist was applied using a hot-roll lamination unit; the photoresist was UV exposed in the desired pattern; the exposed photoresist was developed with a sodium carbonate solution; the copper was etched with a cupric chloride etchant; the remaining photoresist was removed with a sodium hydroxide solution. To the circuit side of the sample was laminated the adhesive side of a polyimide-adhesive composite with the same adhesive composition used in the copper clad composite. A vacuum hydraulic press at 375° F. (190° C.) and 350 psi (62.5 kg/cm$^2$) was used for a one-hour lamination.

Single-strand Teflon® insulated wire was soldered to the positive and negative leads of the conductor pattern. A test sample was wired in series with an external resistor and a 50 v. DC power supply and placed in an environmental chamber set for 85° C. and 85% relative humidity. The insulation resistance of the sample was calculated from a measured voltage drop across the external resistor. Conditions were maintained at +/−2° C. and +/−2% RH for up to 1000 hours.

5. Stain and dendrite formation

Samples for the M&IR test were visibly inspected for stain and for dendrite formation during and after testing.

Example 1

This example illustrates the properties of adhesives made with different copolymers of the invention.

Adhesive compositions were prepared by mixing the following ingredients, with amounts in weight percent based on adhesive dry solids:

| | Sample | | | | |
|---|---|---|---|---|---|
| Material | 1-1 | 1-2 | 1-3 | 1-4 | 1-5 |
| Copolymer 1 | 94.2 | | | | |
| Copolymer 2 | | 93.9 | | | |
| Copolymer 3 | | | 90.9 | | |
| Copolymer 4 | | | | 94.6 | |
| Copolymer 5 | | | | | 93.8 |
| Crosslinker | 3.1 | 3.0 | 2.5 | 1.0 | 3.0 |
| Sb$_2$O$_5$ | 2.0 | 2.5 | 5.5 | 2.5 | 2.5 |
| ASE-60 | 0.6 | 0.5 | 1.0 | 0.6 | 0.6 |
| Surfactant 1 | 0.1 | 0.1 | 0.1 | | 0.1 |
| Surfactant 2 | | | | 1.3 | |

The adhesive compositions were used to prepare polyimide-adhesive coverlays and Type II double-sided copper clad composites with both pink and 10 black copper, as described above. The Kapton® film was 1 mil (0.0025 cm) thick and the adhesive coating was 1 mil (0.0025 cm) thick. The lamination was carried out at 375° F. (190° C.) and 300 psi (53.6 kg/cm$^2$) for one hour. The samples were tested with the results shown below.

| Sample | M&R | Stain | Dendrites | Solder Float | Flammability |
|---|---|---|---|---|---|
| 1-1 | 500 | no | no | >120 | Pass |
| 1-2 | 55 | no | no | >120 | Pass |
| 1-3 | 64 | sl | no | >120 | Pass |
| 1-4 | 120 | NA | NA | >120 | Pass |
| 1-5 | 110 | no | no | >120 | Pass |

| | Peel Strength | | | |
|---|---|---|---|---|
| | Cu-pink | | Cu-black | |
| Sample | AR | AS | AR | AS |
| 1-1 | 5.4 (0.96) | 4.5 (0.80) | 7.6 (1.36) | 6.8 (1.21) |
| 1-2 | 9.7 (1.73) | 9.5 (1.7) | 10.2 (1.82) | 9.5 (1.7) |
| 1-3 | 7.2 (1.28) | 6.7 (1.19) | 7.5 (1.33) | 7.4 (1.32) |
| 1-4 | 7.1 (1.27) | 7.0 (1.25) | | |
| 1-5 | 8.3 (1.48) | 8.1 (1.45) | 9.0 (1.61) | 8.5 (1.52) |

M&IR reported in $10^7$ ohms solder float reported in seconds peel strength reported in pounds per linear inch (mg/cm) sl=slight Example 2

This example illustrates the superior solder float resistance of the flame retardant adhesive compositions of the invention as compared to similar compositions containing methacrylic acid, a crosslinker conventionally used in acrylic adhesive formulations.

Adhesive compositions were prepared by mixing the following ingredients, with amounts in weight percent based on adhesive dry solids:

| | Sample | | |
|---|---|---|---|
| Material | 2-6 | C-A | C-B |
| Copolymer 1 | 92.7 | | |
| Comp. Copolymer A | | 94.6 | |
| Comp. Copolymer B | | | 92.7 |
| Crosslinker | 5.0 | 3.1 | 5.0 |
| $Sb_2O_5$ | 2.0 | 2.1 | 2.0 |
| PEO | 0.3 | | |
| ASE-60 | | 0.3 | 0.3 |

The adhesive compositions were used to prepare polyimide-adhesive coverlays and Type I double-sided copper clad composites with pink copper, as described above. The Kapton® film was 2 mil (0.0051 cm) thick for Samples 2–6 and C-B; 1 mil (0.0025 cm) thick for Sample C-A. The adhesive coating was 2 mil (0.0051 cm) thick for Samples 2–6 and C-A; 1.4 mil (0.0036 cm) thick for Sample C-B. The lamination was carried out at 375° F. (190° C.) and 350 psi (62.5 kg/cm²) for one hour. The samples were tested in the solder float test with the results shown below.

| Sample | Solder Float (sec) |
|---|---|
| 2-6 | >120 |
| C-A | 3 |
| C-B | 12–50 |

Superior solder float performance was also seen with samples 1-1 through 1-5 in Example 1.

Example 3

This example illustrates the superior properties of the adhesive compositions of the invention as compared to two commercial adhesive formulations.

The adhesive composition of Examples 2–6 was used to prepare a polyimide-adhesive coverlay and Type I double-sided copper clad composite, as described above. For comparison, coverlay and double-sided copper clad composites were also made with two commercial adhesives: Pyralux® LF and Pyralux® FR (E. I. du Pont de Nemours and Company, Wilmington, Del.). The copper clad composites were made with pink copper. The Kapton® film was 2 mil (0.0051 cm) thick and the adhesive coating was 2 mil (0.0051 cm) thick. The lamination was carried out at 375° F. (190° C.) and 350 psi (62.5 kg/cm²) for one hour. The samples were tested for M&IR, stain, dendrites and transparency, with the results shown below.

| Sample | M&IR | Stain | Dendrites | Transparent |
|---|---|---|---|---|
| Example 3 | 180 | no | no | yes |
| Pyralux ® LF | 5.6 | yes | yes | yes |
| Pyralux ® FR | 4.8 | yes | yes | no |

M&IR reported in $10^7$ ohms

What is claimed is:

1. A composite structure comprising a layer of the adhesive composition adhered to one or both sides of a substrate, said adhesive composition comprising:
    A. 80–98% by weight, based upon the total amount of adhesive dry solids, of at least one latex copolymer made from monomers comprising:
        (1) 20–55% by weight, based upon the weight of the copolymer, of at least one brominated aromatic monomer,
        (2) 5–15% by weight, based upon the weight of the copolymer, of a monomer selected from the group consisting of glycidyl acrylate, glycidyl methacrylate, and mixtures thereof, and
        (3) 40–60% by weight based upon the weight of the copolymer, of at least one non-brominated monofunctional (meth)acrylate monomer;
        (4) 0–10% by weight, based upon the weight of copolymer, of a monomer selected from the group consisting of acrylonitrile, methacrylonitrile, and mixtures thereof;
    B. 0–10% by weight, based upon the total amount of adhesive dry solids, of at least one crosslinking agent;
    C. 1–10% by weight, based upon the total amount of adhesive dry solids, of at least one antimony oxide; and
    D. 0–15% by weight, based upon the total amount of adhesive dry solids, of at least one viscosity modifier.

2. The composite structure of claim, 1 wherein the substrate comprises a release layer comprising polyester or paper coated with a release agent.

3. The composite structure of claim 1 wherein the substrate is selected from the group consisting of metal foil, polyimide film, polyamide film, polyethylene terephthalate film, polyethylene naphthalate film, polyaramid paper, woven glass fabric, non-woven glass fabric, polyimide impregnated glass fabric and epoxy impregnated glass fabric.

4. The composite structure of claim 3 wherein the substrate is polyimide film having adhered to on one side a layer of the adhesive composition of claim 1 adhered to a metal foil.

5. The composite structure of claim 3 wherein the substrate is polyimide film having adhered to on both sides a layer of the adhesive composition of claim 1 adhered to a metal foil.

* * * * *

UNITED STATES PATENT AND TRADEMARK OFFICE
CERTIFICATE OF CORRECTION

PATENT NO. : 6,368,716 B2
DATED : April 9, 2002
INVENTOR(S) : Melvin A. Neiss

It is certified that error appears in the above-identified patent and that said Letters Patent is hereby corrected as shown below:

Column 10,
Line 21, delete "the" and insert -- an -- therefor.
Line 35, after "weight" insert -- , --.
Line 38, after "of" insert -- the -- .

Signed and Sealed this

Nineteenth Day of November, 2002

Attest:

JAMES E. ROGAN
Attesting Officer
Director of the United States Patent and Trademark Office